United States Patent
Maruyama

(10) Patent No.: US 6,496,783 B1
(45) Date of Patent: Dec. 17, 2002

(54) ELECTRIC POWER CALCULATION SYSTEM

(75) Inventor: Ryoji Maruyama, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/518,150

(22) Filed: Mar. 3, 2000

(30) Foreign Application Priority Data

Mar. 5, 1999 (JP) .............................. 11-057815

(51) Int. Cl.$^7$ ............................................. G01R 11/24
(52) U.S. Cl. ........................................ 702/65; 324/622
(58) Field of Search ................ 702/65, 64, 79, 702/189, 190, 194, 198, 182; 324/600, 605, 609, 612, 617, 619, 622, 674

(56) References Cited

U.S. PATENT DOCUMENTS

| | | | |
|---|---|---|---|
| 4,454,471 A | | 6/1984 | Schwendtner et al. ...... 324/141 |
| 4,746,900 A | | 5/1988 | Shibuya et al. ............ 340/347 |
| 5,017,924 A | * | 5/1991 | Guiberteau et al. ........... 327/94 |
| 5,170,115 A | | 12/1992 | Kashiwabara et al. ...... 324/142 |
| 5,301,121 A | * | 4/1994 | Garverick et al. .......... 324/115 |
| 5,590,155 A | * | 12/1996 | Yasuda ....................... 332/103 |
| 5,924,050 A | | 7/1999 | Maruyama ................... 702/60 |

FOREIGN PATENT DOCUMENTS

| | | |
|---|---|---|
| DE | 30 43 303 | 7/1982 |
| DE | 30 45 033 | 7/1982 |
| DE | 36 41 676 | 6/1987 |
| DE | 195 39 547 | 4/1997 |
| DE | 196 13 732 | 10/1997 |
| EP | 0 455 518 | 1/1996 |
| EP | 0 793 106 | 9/1997 |
| EP | 0 607 711 | 3/1999 |
| JP | 1-224675 | 9/1989 |
| JP | 6-207955 | 7/1994 |
| JP | 9-292417 | 11/1997 |

OTHER PUBLICATIONS

James W. Dally et al., Instrumentation for Engineering Measurements, 1993, John Wiley & Sons, Inc., Second Edition, pp. 189–194.*

* cited by examiner

Primary Examiner—Marc S. Hoff
Assistant Examiner—Edward Raymond
(74) Attorney, Agent, or Firm—Foley & Lardner

(57) ABSTRACT

A voltage (V1) and a current (A1), input from input terminals (T1) and (T2), are A/D converted to 1-bit output data by delta modulators and 1-bit output data of the delta modulator is delayed, using a phase-shifting circuit implemented by either a RAM (semiconductor memory) or shift registers, by an amount equivalent to 90° of the input voltage (V1), before a subsequent circuit performs a calculation of a reactive power. This circuit configuration reduces analog circuitry and enables a compact, low-cost implementation, even for use in an LSI.

33 Claims, 8 Drawing Sheets

ELECTRIC POWER CALCULATION SYSTEM

BACKGROUND OF THE INVENTION

1. Field of the Invention

The present invention relates to an electric power calculation system for digital calculation of a current value or integrated value of electric power, in particular of reactive power, from received analog voltage and current.

2. Description of the Related Art

For an electric power supply line having a voltage V and a current I, with a phase angle ψ in between, an active power W is determined such that W=V·I·cos ψ, and a reactive power Q, such that Q=V·I·sin ψ. As V·I sing ψ=−V·I·cos (ψ−90°), the calculation of reactive power is generally implemented by shifting an instantaneous voltage or an instantaneous current at 90° in phase.

FIG. 1 shows a reactive power calculation system CSO performing a calculation of reactive power in a conventional electric power calculation system.

The calculation system CSO comprises a pair of AD (analog-to-digital) converters 201, 202, and a microcomputer 203.

The converter 201 samples a number of times equivalent to a necessary number of bits an analog signal V1 which is input from an input terminal T1 and directly proportional to an instantaneous voltage of a system under measurement, and converts it to a corresponding digital voltage date D1. The converter 202 samples an identical number of times an analog signal A1 which is input from an input terminal T2 and directly proportional to an instantaneous current of the system under measurement, and converts it to a corresponding digital current date D2.

The microcomputer 203 follows a program on an incorporated CPU (central processing unit), for executing phase shift and multiplication processes of the input data D1, D2 to calculate an instantaneous reactive power Q [Var], and for integrating this to calculate a reactive electric energy ∫Q [Varh].

In this system in which a phase shift process of voltage or current data is effected on software, it is required to repeat the phase shift process a number of times corresponding to the number of bits output from the converter 201 or 202, constituting a neck for the speed to be increased, in this concern, for a speed-up to be achieved by paralleled processes, there arises an increase in memory or register capacity, leading to a scaled-up configuration to be high of cost.

Moreover, the multiplication process on software needs many repeated processes to be executed within a fixed time interval in cycle, and parallel jobs to be burdened on the microcomputer 203, such as for a display process, causes the more scaled-up configuration.

Further, the use of converters 201, 202 gives rise to a progressive additional scale-up in configuration for AD conversion, when accompanying an intention for increasing the number of bits of digital data to have a raised number of significant figures.

SUMMARY OF THE INVENTION

The present invention has been made with such points in view. Accordingly, it is an object of the present invention to provide an electric power calculation system that can achieve, at a relatively low cost and high speed, the execution of a signal processing of analog voltage and current signals it has received for a digital calculation to determine a current or integrated value of electric power, in particular of a signal processing including a phase shift process for a digital calculation of reactive power.

It is desirable for the system to be configured compact with a possibly greater number of system elements implemented as hardware, and it is more desirable if an entire system can be implemented as an LSI.

An aspect of the present invention to achieve the object described is an electric power calculation system comprising a first system element for inputting a first analog signal representing a voltage alternating with a period and a second analog signal representing a current alternating with the period, and outputting a first digital signal representing an input value of the first analog signal and a second digital signal representing an input value of the second analog signal, the first system element including a phase-shifting circuit for phase-shifting one signal of the first and second analog signals and the first and second digital signals by holding a circuit status wholly representing a signal value of the one signal, and a second system element for executing a calculation process of the first and second digital signals output from the first system element to provide a third digital signal representing a reactive power associated with the voltage and the current.

According to the aspect of the invention, one of a pair of analog input signals representing a voltage and a current having an identical period or one of a pair of digital signals representing input values of the input signals is shifted in phase as necessary by a phase-shifting circuit in a system element, and correspondent digital signals are output from the system element to another system element, where they are processed for calculation 10 provide a digital signal representing a reactive power.

The phase-shifting circuit is adapted to have a circuit status that is wholly representative of a signal value of the signal to be shifted in phase, and to bold the circuit status for a necessary time interval for the signal to be phase-shifted, without the need for the phase shift process to be repeated in correspondence to the number of bits of the signal, even when this is a digital signal, thus allowing the speed to be the more increased.

Another aspect of the present invention to achieve the object is an electric power calculation system which coverts signals directly proportional to a voltage and a current of a system under measurement to digital values respectively using A-D converters to calculate a reactive power, wherein a rime delay is imparted to a digital value of the voltage or current to be phase-shifted by phase shift means using a semiconductor memory.

This aspect of the invention enable a redaction in analog portion of the system configuration, and provides a compact and low cost configuration, even when implemented as an LSI. It also minimizes and facilitates software processing.

Another aspect or the present invention to achieve the object is an electric power calculation system which coverts signals directly proportional to a voltage and a current of a system under measurement to digital values respectively using A-D converters to calculate a reactive power, wherein a time delay is imparted to a digital value of the voltage or current to be phase-shifted by phase shift means using shift registers.

This aspect of the invention also enable a reduction in analog portion of the system configuration, and provides a low cost configuration, even when implemented as an LSI. It permits an entire configuration to be implemented as hardware.

Another aspect of the present invention to achieve the object is an electric power calculation system which covens signals directly proportional to a voltage and a current of a system under measurement to digital values respectively using A-D converters to calculate a reactive power, wherein a phase shift is performed by a phase-shifting circuit formed by a capacitor, a resistor, and an operational amplifier, disposed before an A-D converter at a voltage side or current side.

This aspect of the invention also enable an electric power calculation system to be entirely configured as hardware.

BRIEF DESCRIPTION OF THE DRAWINGS

The above and further objects and novel features of the present invention will more fully appear from the following derailed description when the same is read in conjunction with the accompanying drawings, in which.

DETAILED DESCRIPTION OF THE PREFERRED EMBODIMENTS

Figure 1:
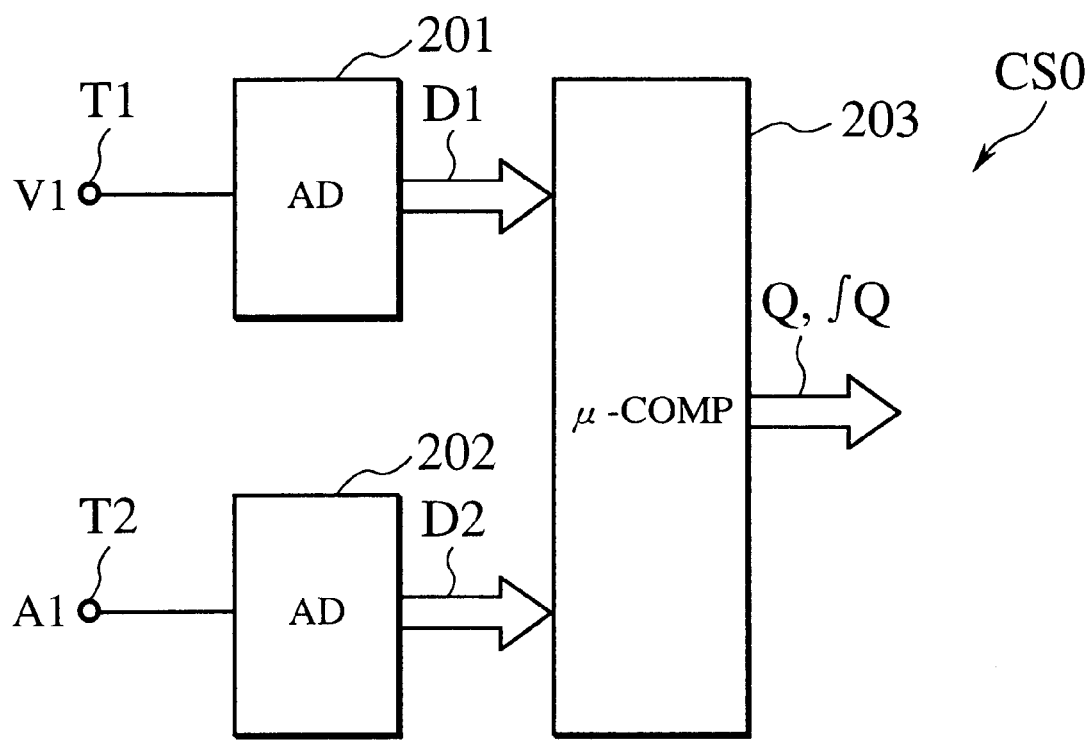
FIG. 1 is a block diagram of a reactive power calculation system in a conventional electric power calculation system.

Embodiments of the present invention are described in detail below, with reference made to relevant accompanying drawings. In the accompanying drawings, corresponding elements are designated by the seine reference characters.

Figure 2:
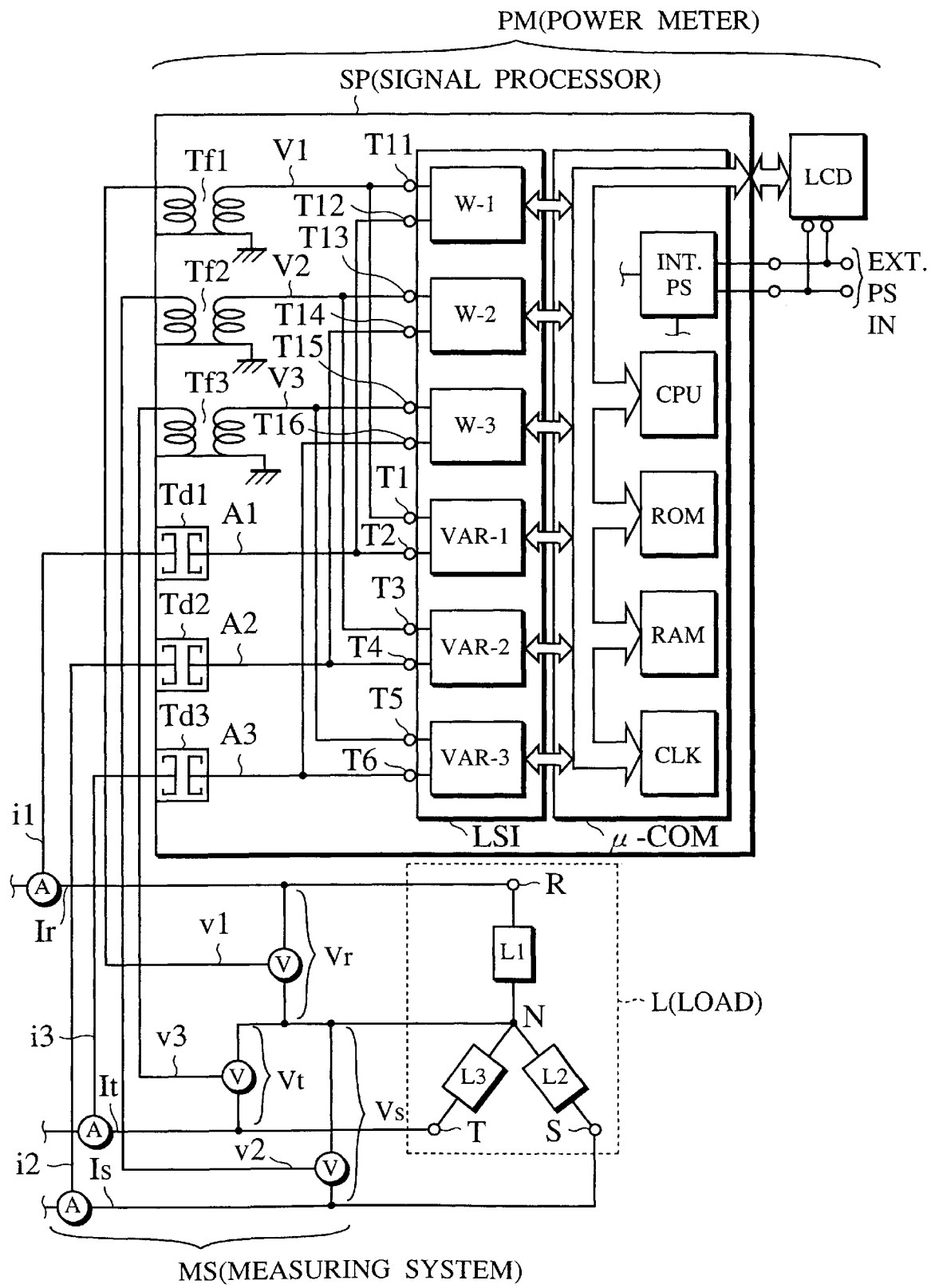
FIG. 2 is a block diagram of an electric power measuring system including a power meter configured as an electric power calculation system according to an embodiment of the invention.

FIG. 2 shows an electric power measuring system including a power meter PM configured as an electric power calculation system according to the first embodiment of the invention.

The electric power measuring system comprises the power meter PM, and a current and voltage measuring system MS connected to a three-phase ac load L.

The power meter PM is implemented as a unit comprising: a signal processor SP for processing analog current and voltage signals it has received from the measuring system MS to calculate therefrom an active electric energy and a reactive electric energy; a liquid crystal display LCD for displaying the calculated active energy and reactive energy; and an enclosure (not shown) configured for accommodating the signal processor SP and the liquid crystal display LCD and provided with external power input terminals EXT. PS IN common thereto and necessary signal input/output ports.

The three-phase ac load L has a star connection of three lines of loads L1, L2, L3. The connection of loads may be a delta.

The current and voltage measuring system MS includes:, voltage sensors (V) for measuring amplitudes of ac voltages Vr, Vs, Vt between a neutral point N and R, S, T terminals of the three-phase ac load L to provide analog voltage signals v1, v2, v3 having their amplitudes directly proportional to instantaneous values of the voltages Vr, Vs, Vt; and current sensors (A) for measuring magnitudes of ac currents Ir, Is, It conducted through the R, S, T terminals of the three-phase ac load L to provide analog current signals i1, i2, i3 having their magnitudes directly proportional to instantaneous values of the currents Ir, Is, It. The measuring system MS may measure currents conducted through a plurality of lines of single-phase ac loads and voltages applied thereto, to output the results in the form of analog current signals i1, i2, i3 and analog voltage signals v1, v2, v3.

The signal processor SP comprises: transducers Td1, Td2, Td3 for a proportional conversion of magnitudes of the analog current signals i1, i2, i3 to provide analog current signals A1, A2, A3 having signal values of adequate magnitudes for a later-described subsequent process; transformers Tf1, Tf2, Tf3 for a proportional conversion of amplitudes of the analog voltage signals v1, v2, v3 to provide analog voltage signals V1, V2, V3 having signal values of adequate magnitudes for the subsequent process; a large-scale integrated circuit LSI for processing the analog current signals (hereafter each respectively simply called "input current" or "current") A1, A2, A3 input from the transducers Td1, Td2, Td3 and the analog voltage signals (hereafter each respectively simply called "input voltage" or "voltage") V1, V2, V3 input from the transformers Tf1, Tf2, Tf3 to digitally calculate current values [W, Var] of active power and reactive power respectively for the R, S, T phases; a microcomputer adapted for distributing clocks to the integrated circuit LSI, and to be responsible for the digital signals input from the integrated circuit LSI to calculate values representing integrated values [Wh, Varh] of active power and reactive power respectively for the R, S, T phases, as well as for requests from a control circuit in the liquid crystal display LCD or external signals input via an input/output interface (not shown) to provide outputs, such as correspondent calculation results and/or control commands, to the liquid crystal display LCD or for external use; and an internal power supply INT. PS for supplying power to the entirety of the signal processor SP, as necessary.

The microcomputer comprises: a ROM (read only memory) for storing necessary programs and data; an internal clock CLK; a CPU for processes to be executed in dependence on the programs, such as for clock distribution, calculation for the integration and management of calculation results, and control for the liquid crystal display LCD and external circuitry; and a RAM (random access memory) for storing calculation results and associated data, as necessary. To this point, the clock distribution to the integrated circuit LSI may be implemented in the form of an electric circuit to be incorporated in the integrated circuit LSI, thereby to additionally reduce the burden on the microcomputer.

The integrated circuit LSI comprises; first to third reactive power calculators Var-1, Var-2, Var-3 provided with input terminals T1 and T2, T3 and T4, T5 and T6, respectively, and adapted for processing the input voltages and currents V1 and A1, V2 and A2, V3 and A3 received at those terminals, respectively, to provide current values of reactive power by phases of the three-phase ac load L; and first to third active power calculators W-1, W-2, W-3 provided with input terminals T11 and T12, T13 and T14, T15 and T16, respectively, and adapted for processing the input voltages and currents V1 and A1, V2 and A2, V3 and A3 received at these terminals, respectively, to provide current values of active power by phases of the three-phase ac load L.

The power meter PM described is thus configured as an electric power calculation system comprising: an interface (as a set of transducers Td1, Td2, Td3 and transformers Tf1, Tf2, Tf3) for inputting the analog current signals I1, I2, I3 and the analog voltage signals v1, v2, v3; an electric power calculator (as the integrated circuit LSI) for digitally processing analog currents I1, I2, I3 and voltages V1, V2, V3 input via the interface to calculate current values of active power and reactive power of a plurality of lines; an integrator (implemented as a processing function for calculation of the microcomputer) for integrating calculated values from the power calculator; and a display (as the liquid crystal display LCD) for indicating electric energy determined by the integrator, as necessary.

Further, in light of respective active and reactive power calculators W-1, W-2, W3 and Var-1, Var-2, Var-3 constituting the integrated circuit LSI, the electric power calculation system is configured as a combination of the interface, a plurality of lines of active electric energy calculation systems (each respectively constituted with an individual active power calculator and a corresponding integration process), a plurality of lines of reactive electric energy calculation systems (each respectively constituted with an individual reactive power calculator and a corresponding integration process), and the display.

Figure 3:
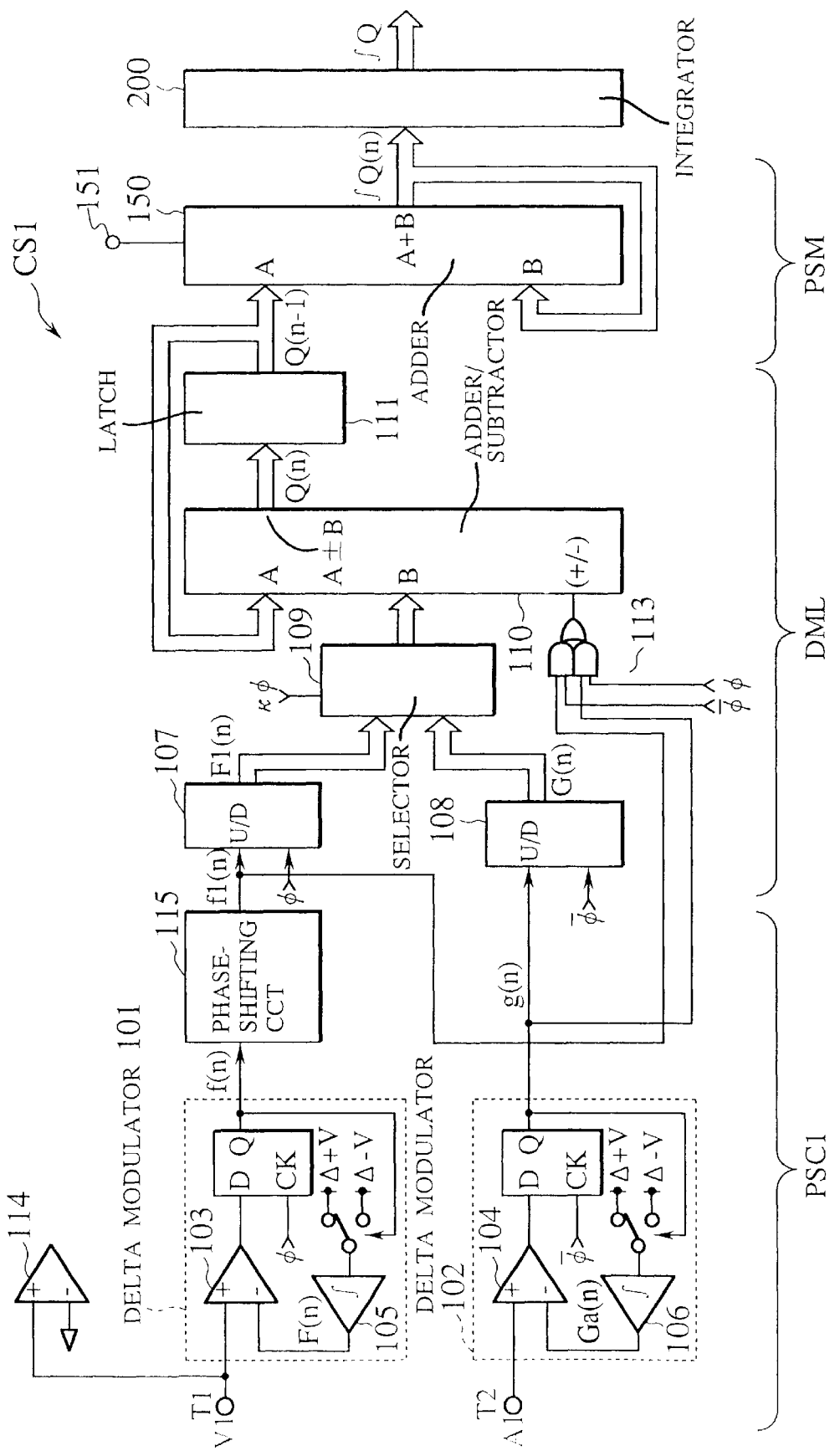
FIG. 3 is a block diagram of a reactive energy calculation system in the power meter of FIG. 2.
Figure 4:
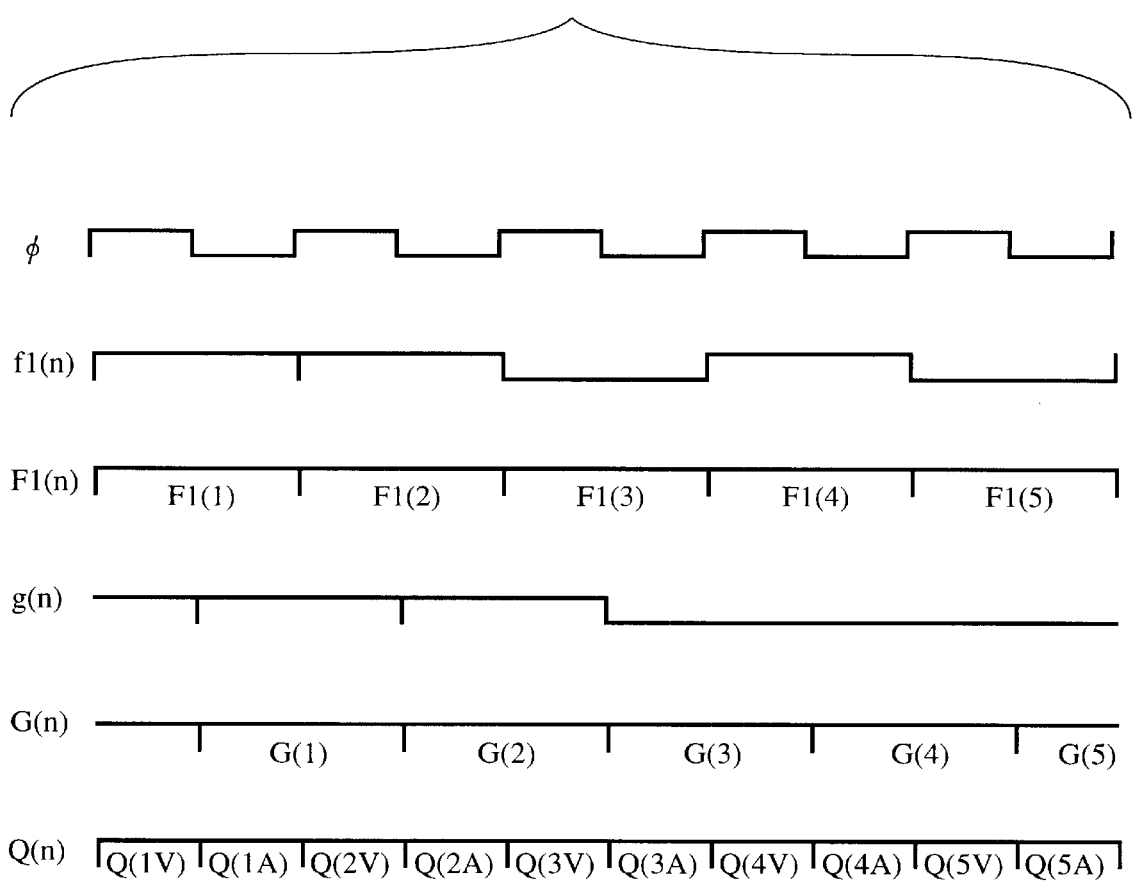
FIG. 4 is a time chart describing timings of actions of a reactive power calculator in the reactive energy calculation system of FIG. 3.

FIG. 3 shows one line of calculation system CS1 of the plurality of lines of reactive energy calculation systems, and FIG. 4 illustrates timings of actions of a reactive power calculator (Var 1) of the calculation system CS1.

The calculation system CS1 comprises the reactive power calculator (Var-1), and an integrator 200 implemented as an integration process of the microcomputer corresponding thereto. In this concern, the integrator 200 may be incorporated as a solid state circuit in the reactive power calculator (Var-1), to thereby render the calculator (Var-1) configured as a reactive energy calculator.

The reactive power calculator (Var-1) comprises: a phase-shifting AD converter PSC1 as a quantizing phase shift circuit adapted for converting an analog input current A1 received at the terminal T2 into a digital current signal g(n) by quantization into a string of one-bits to be n in period resolution, and for converting an analog input voltage V1 received at the terminal T1 into a digital voltage signal f(n) by analogous quantization into a string of one-bits to be n in period resolution, and additionally for imparting a delay of one-fourth of a period of the input voltage V1 in the voltage signal f(n) to be shifted in phase to provide a phase-shifted voltage signal f1 (n); a digital multiplier DML as a multiplication circuit for performing addition/subtraction (+1-) of simple sample values G(n) and F1 (n) of the digital current signal g(n) and phase-shifted voltage signal f1 (n) to execute a multiplication (g×f1) process between the current and voltage signals g(n) and f1 (n); and a periodical power summer PSM as an addition circuit for adding (+) multiplication results Q(n) of the multiplier DML to determine a periodical total sum ∫Q(n) to be output as a current value Q (that is an average value in a current period) of reactive power. The integrator 200 is adapted for integrating ∫Q the current value Q of reactive power to provide a total amount of reactive power between from a rest time of the power meter PM to a current time in terms of Varh.

The phase-shifting AD converter PSC1 comprises a pair of delta modulators 101, 102, a phase-shifting circuit 115, and a comparator 114.

The delta modulators 101 and 102 function as one-bit A-D converters, respectively, and convert the voltage V1 and the current Al input at the terminals T1 and T2 to one-bit coded pulse signals f(n) and g(n) to be output. The timing therefor depends on a clock φ for the delta modulator 101, and on an inversion of the clock φ for the delta modulator 102.

With respect to the delta modulator 101, at a rising edge of the clock φ, the magnitude of the input voltage V1 is compared at a comparator 103 with an output voltage F(n) of an integrator 105, and when a condition V1>F(n) is met, the delta modulator 101 outputs a high level 'H' and the integrator 105 integrates up by an amount +Δv. However, if V1<F(n), there is output a low level 'L', and the integrator 105 integrates downward by −Δv.

With respect to the delta modulator 102, at a falling edge of the clock φ(that is at a rising edge of the inversion thereof), the magnitude of the input current A1 is compared at a comparator 104 with an output current G(n) of an integrator 106, and when a condition A1>G(n) is met, the delta modulator 102 outputs a high level 'H' and the integrator 106 integrates up by an amount +Δv. However, if A1<G(n), there is output a low level 'L', and the integrator 105 integrates downward by −Δv.

The phase-shifting circuit 115 imparts a delay to the output pulse signal f(n) of the delta modulator 101 by 90°, thereby outputting a pulse signal f1 (n). The delay time and timing are calculated by referencing an output signal from the comparator 114.

The digital multiplier DML comprises a pair of up/down counters 107 and 108, a data selector 109, an adder/subtractor 110, a latch 111, and a logic 113.

The up/down counters 107 and 108 count up or down the number of pulses of the clock φ and the inversion thereof, respectively, in accordance with bit values "1", "0" of the phase-shifted voltage signal f1 (n) and the current signal g(n), and output counted values as the simple sample values F1 (n) and G(n), with the same results as after A-D conversion of a phase-shifted status value of the voltage V1 and an input value of the current A1, as they are sampled at a high speed, respectively. In this respect, the up/down counters 107, 108 may be deemed as parts of the phase-shifting AD converter PSC1.

The data selector 109 selects the output F1 (n) of the up/down counter 107 or the output G(n) of the up/down counter 108, to be changed over to be input to the adder/subtractor 110, in dependence on a clock signal κφ(where K is a factor determined for synchronism with a sampling speed, and κ=1 in this embodiment). There is selected F1 (n) with the clock signal κφ at a high level 'H', or G(n) with the clock signal κφ at a low level 'L'.

The logic 113 outputs to the adder/subtractor 110 an OR of an AND between the output g(n) of the delta modulator 102 and the clock φ and an AND between the output F1 (n) of the phase-shifting circuit 115 and the inversion of the clock φ. There is selected the output g(n) of the delta modulator 102 with the clock φ at high level 'H', or the output f1 (n) of the phase-shifting circuit 115 with the clock φ at low level 'L'.

The adder/subtractor 110 has an A node, a B node, and a (+/-) node for input, and an (A±B) node for output. An output Q(n-1) of the latch 111 is input to the A node, the output F1 (n) or G(n) of the data selector, to the B node, and an output of the logic 113, to the (+/-) node. In dependence on an input value to the (+/-) node, the adder/subtractor 110 performs an addition/subtraction process {Q(n-1) ±(F1 (n) or G(n))}, and a resultant Q(n) is output from the (A±B) node to the latch 111. The addition/subtraction process is rendered for addition with an 'H' input to the (+/-) node, or for subtraction with a 'L' input. The result Q(n) of this process stands as a proportional value to a phase-shifted status value of (instantaneous) voltage V1 times an input status value of (instantaneous) current A1.

The latch 111 has a previous data Q(n-1) held therein until a current data Q(n) comes from the adder/subtractor 110, and holds the current data Q(n), as this data Q(n) is input. The latch 111 outputs the value of a held data.

The periodical power summer PSM has an incorporated simple addition circuit which resets to a zero value, outputting an overflow signal at a terminal 151 therefor each time when a prescribed value is exceeded by an addition of Q(n). The microcomputer has a simple calculation function for simply counting up the overflow signal from the terminal 151 to determine a reactive energy, and can select this function by an external signal to be given such as when the load L is in a stationary working state, for an enhanced reduction of burden on the microcomputer.

The simple addition circuit may be removed from the power summer PSM, or to the contrary, the summer PSM and the integrator 200 may be removed to be replaced with a combination of the simple addition circuit and the simple calculation function to be normally employed.

The second and third reactive power calculators Var-2 and Var-3 are each Identical in circuit configuration to the first reactive power calculator Var-1, and their description is omitted. The active power calculators W-1, W-2 and W-3 have a circuit configuration analogous to the reactive power calculator Var-1, as the phase-shifting circuit 115 is removed, and are in no way different therefrom in function either, except for the phase shift function, and their description also is omitted.

Figure 5:
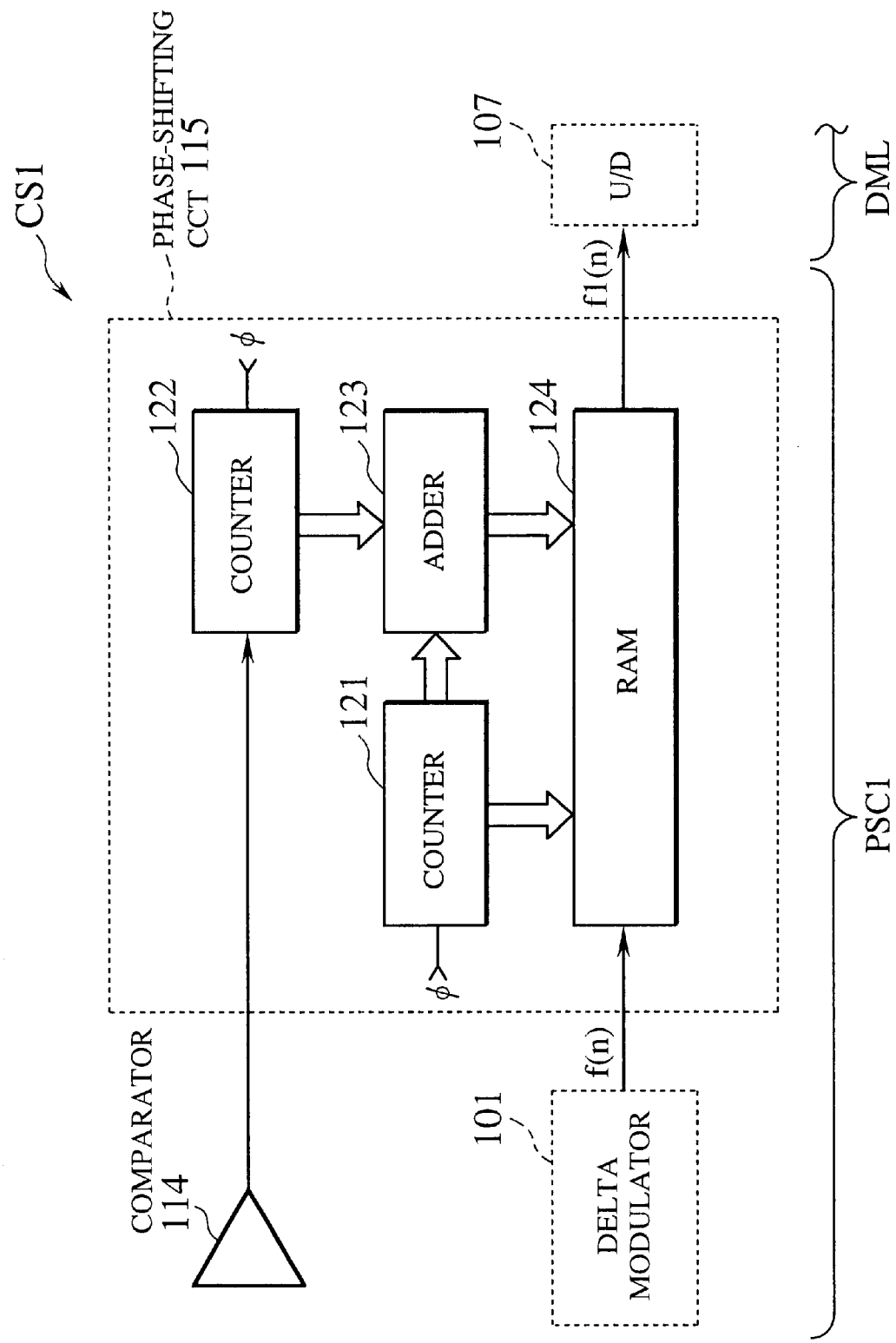
FIG. 5 is a block diagram of a phase-shifting circuit in the reactive energy calculation system of FIG. 3.

FIG. 5 shows the configuration of the phase-shifting circuit 115.

The phase-shifting circuit 115 comprises two counters 121, 122, an adder 123, and a RAM 124 as a semiconductor memory.

The counter 121 counts in free-run mode a clock φ, synchronized with the clock φ that drives the delta modulator 101, and employs the count value for write addressing of the RAM 124.

The counter 122 counts the number of pulses of the same clock φ as applied to the counter 121, for one period of the input voltage V1 for example, in dependence on an output of the comparator 114, and shifts lower two bits of the count value to calculate the number of clocks in one-fourth of the period of the input voltage V1 (that is the delay time of 90°).

The adder 123 adds to a value indicating a write address of the RAM 124 output from the counter 121 a value indicating one-fourth of the count value for one period output from the counter 122, to thereby calculate a address for the amount of 90° delay. The output of the adder 123 indicates a read address of the RAM 124.

While in the above-noted description, the counter 122 Is configured so as to count the number of clock pulses during one period of the input voltage V1 and output the count value for each period, it is alternately possible to have a configuration in which the number of clock pulses in a plurality of periods is counted, and the count value is output every plurality of periods. Thus, even if the count value is output for every plurality of periods, it is possible at the adder 123 to calculate the number of clock pulses for one-fourth period from the input number of clock pulses for the plurality of periods, to add the value to the write address of RAM 121 so as to calculate the address for the amount of 90° delay.

Additionally, if the configuration is made such that at the counter 122 the count value for one-fourth period is calculated from the number or clock pulses from one or a plurality of periods and this value is output, it is possible at the adder 123 for that value to be added as is to the value indicating the write address of the RAM that is output by the counter 121, thereby calculating the read address.

At addresses indicated by the counter 121, the output signal of the delta modulator 101 is sequentially stored in the RAM 124 at each clock pulse. The address data indicated by the adder 123 is sequentially output at each clock pulse and input to the up/down counter 107 at the next stage. Because it is sufficient for the RAM 124 to store 1 bit, a 1-bit-by-N RAM is used, where N is a value that is sufficiently high to accommodate the count value of one-fourth of the period of the input voltage V1, and the maximum count value of the counter 121 matches the N. The RAM 124 may be rendered common among the reactive power calculators Var1, Var-2, Var-3, as correspondent address calculations are performed.

As described above, in this embodiment of the invention, the phase-shifting circuit 115 is formed by the RAM 124 that successively stores the 1-bit output data of the delta modulator 101, the counter 121 for counting clock pulses and indicating the write address of the RAM 124, the counter 122 provided for establishing the amount of phase shift, which is a frequency detection means that counts the frequency of the signal V1 (50 Hz, for example) directly proportional to a voltage of the system under measurement, and an adder provided for adding the count value o the counter 121 and the output value of the counter 122 so as to indicate the read address of the RAM 124.

According to this configuration, the 1-bit output data of the delta modulator 101 is delayed by the amount of 90° of the input voltage V1, making it possible to perform a calculation of the reactive power using the system shown in FIG. 5.

The above-described embodiment of the invention provides a number of advantages. Firstly, because the analog circuitry is extremely simple (comprising just the delta modulator 101, which is a 1-bit A-D converter), a low-cost and compact LSI implementation can be achieved. Additionally, whereas the phase-shifting circuit 115 is normally required to perform a shift of a large number of bits, this being as many as 16 bits, a processing is performed at the delta modulator 101 output stage, 1-bit data processing being performed, thereby enabling a compact circuit. Secondly, by minimizing the software processing, software processing is facilitated. Thirdly, the ability to raise the sampling speed enables high precision.

There will be described below a reactive power calculation system CS2 according to the second embodiment of the present invention, with reference to FIG. 6.

Figure 6:
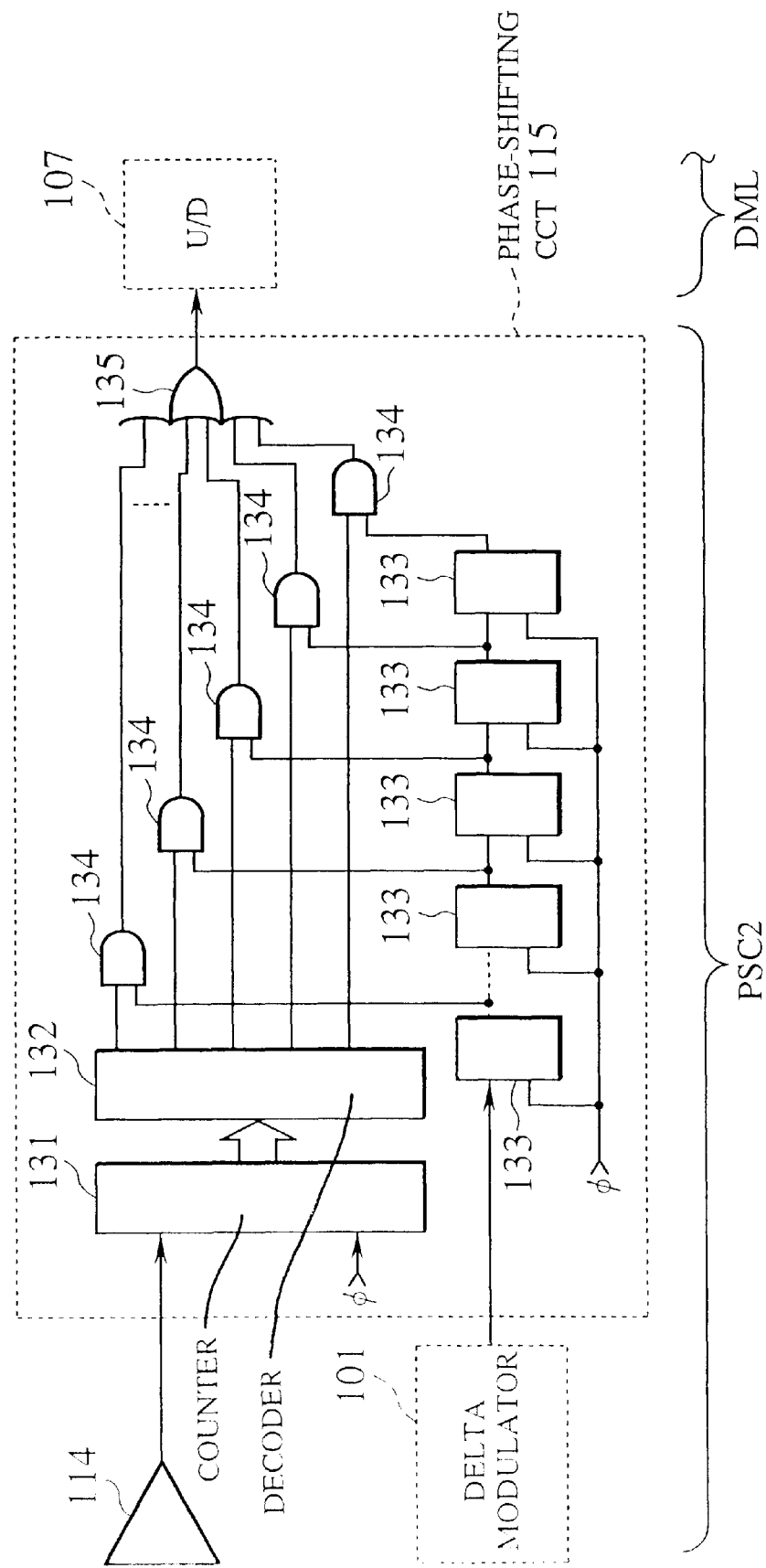
FIG. 6 is a block diagram of a phase-shifting circuit in an electric power calculation system according to another embodiment of the invention.

The calculation system CS2 is different from the calculation CS1 of the first embodiment in that its phase-shifting AD converter PCS2 is modified in configuration from the RAM type of the phase-shifting AD converter PSC1 shown in FIG. 3 to a shift register type shown in FIG. 6.

The converter PSC2 of FIG. 6 has a phase-shifting circuit 115 constituted with a counter 131, a decoder 132, a plurality of shift registers 133, a plurality of AND gates 134, and an OR gate 135.

The counter 131 counts the pulses of clock φ for each period of an input voltage V1 in dependence on an output of a comparator 114, and outputs the count value each period.

The decoder 132 decodes the count value for one period of V1 counted by the counter 131 to a count value corresponding to one-fourth period, and opens a corresponding gate 134 of a plurality of AND gates 134.

The shift registers 133 perform a shifting of the 1-bit data stream output from the delta modulator 101 with the timing of the clock φ(so that each 1-bit output of the delta modulator 101 is shifted). The number of stages of the shift registers 133 is set to be at least enough to shift the data output from the delta modulator 101 by the rime for one-fourth of a period of the input voltage V1.

The OR gate 135 transfers the output of a corresponding stage of shift register 133, in response to the period of V1 counted by the counter 131, to the up/down counter 107.

While the above description is for the case of a configuration whereby the counter 131 counts the clock pulses during one period of the input voltage V1 and outputs the count value for each period, it is alternately possible to have a configuration in which the number of clock pulses in a plurality of periods is counted, this count value being output every plurality of periods. Additionally, it is alternately possible at the counter 131 to calculate the count value for one-fourth of a period from the number of clock pulses for a plurality of counted periods and to output this calculated value.

As described above, in this embodiment, the phase-shifting circuit 115 is formed by shift registers 133 for successively shifting the 1-bit output data of the delta modulator 101, the counter 131 provided for establishing an amount of shift, which is a frequency detection means that counts the frequency of the signal V1 (50 Hz, for example) directly proportional to a voltage of the system under measurement, a group of gates 134 provided for selecting desired shift stages of the shift registers 133, and the decoder 132 for generating a selection signal that selects the gates of the gate 134 group, based on the output of the counter 131.

By using the above-described configuration, the 1-bit output data of the delta modulator 101 is delayed by the amount of 90° of the input voltage V1, making it possible to perform a calculation of reactive power like the calculation system CS1 of the first embodiment.

The above-described embodiment of the present invention provides a number of advantages. Firstly, because the analog circuitry is extremely simple (comprising just the delta modulators 101 and 102, which are 1-bit A-D converters), a low-cost and compact LSI implementation can be achieved. Additionally, whereas the phase-shifting circuit 115 is normally required to perform a shift of a large number of bits, this being as many as 16 bits, processing is performed at the delta modulator 101 output stage, 1-bit data processing being performed, thereby enabling a compact circuit. Secondly, by minimizing the software processing, software processing is facilitated. Thirdly, the ability to raise the sampling speed enables high precision.

There will be described a reactive power calculation system CS3 according to the third embodiment of the present invention, with reference to FIGS. 7 and 8.

Figure 7:
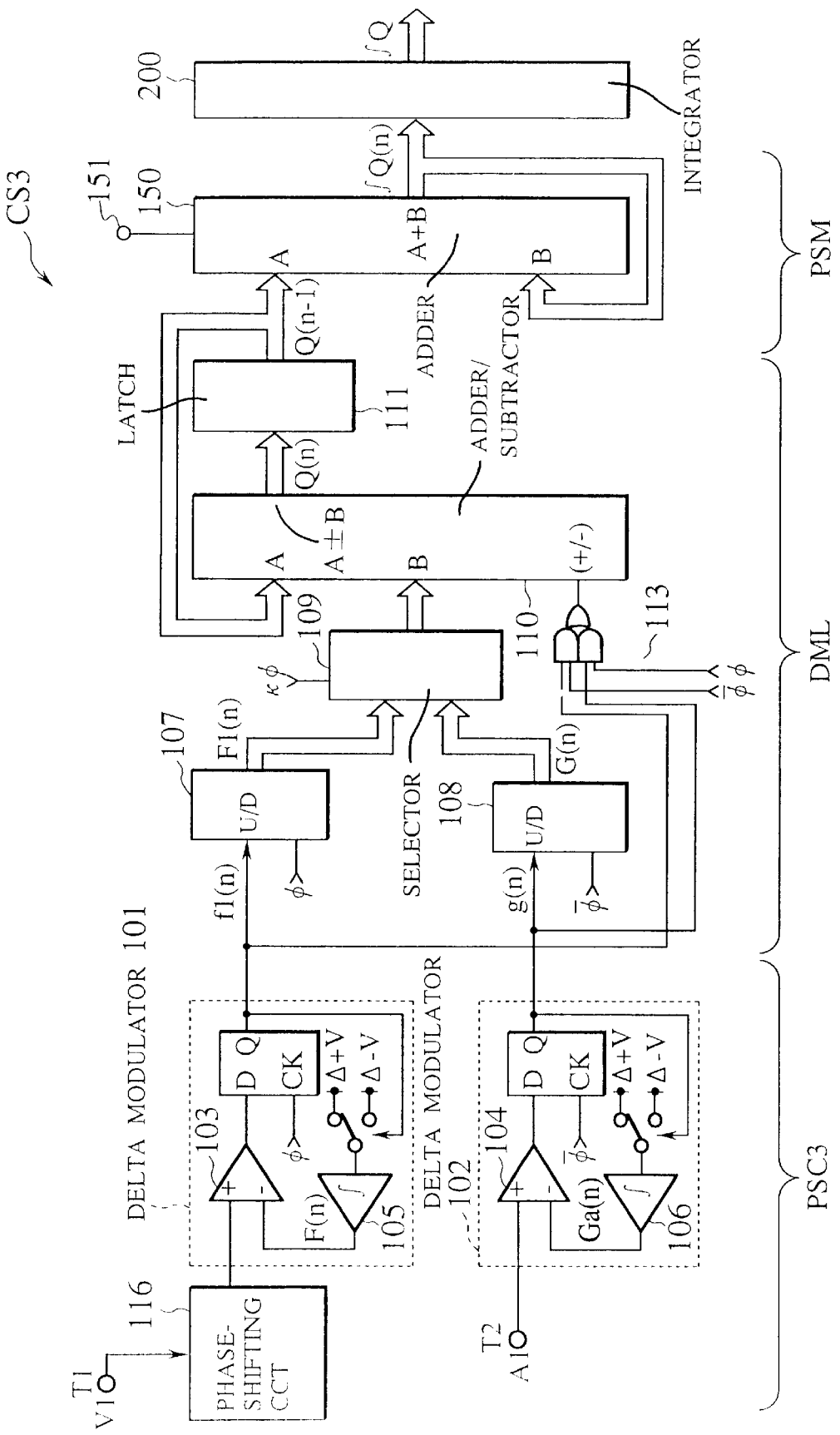
FIG. 7 is a block diagram of a reactive energy calculation system in an electric power calculation system according to another embodiment of the invention.

The calculation system CS3 is different from the first and second embodiments in that its phase-shifting circuit PSC3 is modified from the digital shift type shown in FIG. 3 to an analog shift type shown in FIG. 7.

In the converter PSC2 of FIG. 7, a phases-shifting circuit 116 is interposed between a voltage input terminal T1 and a delta modulator 101, for phase-shifting an analog voltage V1 input to the terminal T1, by one-fourth period.

Figure 8:
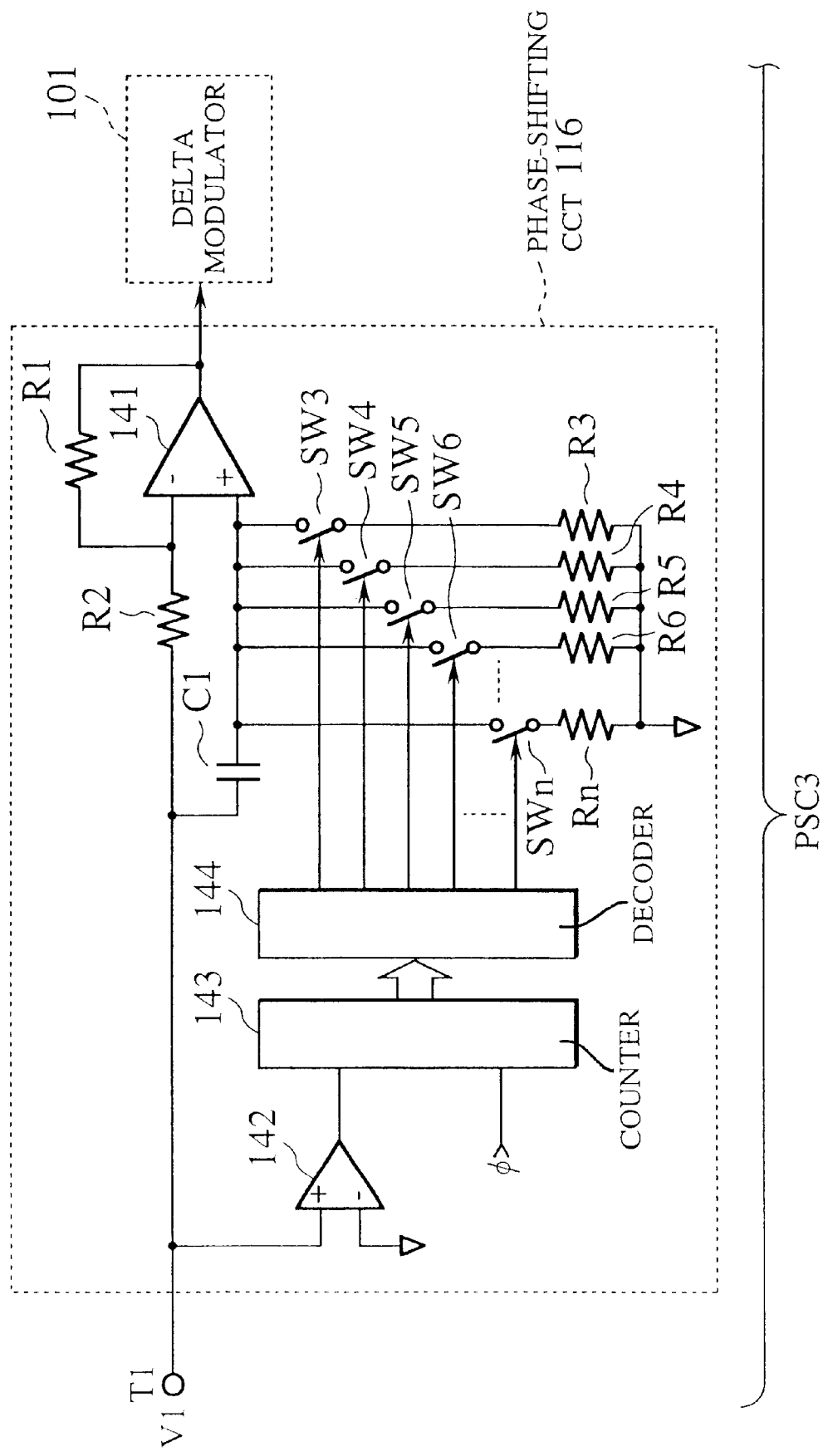
FIG. 8 is a block diagram of a phase-shifting circuit in the reactive energy calculation system of FIG. 7.

As shown in FIG. 8, the phase-shifting circuit 116 is constituted with an operational amplifier 141, registers R1, R2, a condenser C1, a comparator 142, and a plurality of resistors R3 to Rn.

In this embodiment, the phase-shifting circuit is provided as a stage before the delta modulator 101. The amount of phase shift is established by the time constant of the capacitor C1 and the resistors R3 to Rn.

The comparator 142 compares the input voltage V1 and outputs a pulse signal.

The counter 143 counts the pulses of the clock φ during one period of the comparator 142. That is, it counts the number of pulses of clock φ during one period of the input voltage V1 and outputs the count value every one period. The counter 143 can alternately count the number of clock pulses during a plurality of periods of the input voltage V1 and output this count value every plurality of periods.

The decoder 144 decodes the count value for one period (or a plurality of periods) of the input voltage V1 counted by the counter 143 to open a corresponding switch of the group of switches SW3 to SWn.

In this embodiment, the phase-shifting circuit 116 is formed by an operational amplifier 141, a capacitor C1, resistors R1 to Rn, the comparator 142 and counter 143, which serve as a frequency detection means provided to establish an amount of shift by counting the frequency of the signal V1 (50 Hz, for example) directly proportional to a voltage of a system under measurement, switches SW3 to SWn provided for achieving a desired time constant by means of the capacitor C1 and resistors R3 to Rn, and the decoder 144 which selects a desired switches of the switches SW3 to SWn, based on the output of the counter 143.

According to this configuration, the input signal of the delta modulator 101 is delayed by the amount of 90° of the input voltage V1, making it possible to perform a calculation of reactive power using the calculation system CS3 or FIG. 7.

The above-described embodiment of the present invention provides a number of advantages. Firstly, it can be implemented entirely with hardware. Secondly, the ability to raise the sampling speed enables high precision.

In the first to third embodiments, while the description has been for the case of delta modulators 101 and 102 used as 1-bit A-D converters, it is possible to embody the present invention in the same manner using delta sigma modulators in place of the delta modulators 101 and 102.

As will be seen from the foregoing embodiments, according to an aspect of the invention, in the before-mentioned aspects, the A-D converters comprise 1-bit A-D converters. According to another aspect of the invention, in the before-mentioned aspects, the phase shift means imparts a time delay to a 1-bit data output from an A-D converter to effect a phase shift.

According to another aspect of the invention, in the before-mentioned aspects, the phase shift means comprises a semiconductor memory for successively storing a 1-bit data output from the 1-bit A-D converter, a counter for counting a clock and performing write addressing of the semiconductor memory, frequency detection means provided to determine an amount of phase shift for counting a frequency of a signal directly proportional to a voltage or a current of the system under measurement, and means provided for performing read addressing of the semiconductor memory based on a count value of the counter and an output value of the frequency detection means.

According to another aspect of the invention, in the before-mentioned aspects, the phase shift means comprises shift registers for successively shifting a 1-bit data output from the 1-bit A-D converter, frequency detection means provided to determine an amount of phase shift for counting a frequency of a signal directly proportional to a voltage or a current of the system under measurement, gate means provided for selecting a desired shift stage of the shift registers, and a decoder for generating a selection signal selecting a gate of the gate means based on an output of the frequency detection means.

According to another aspect of the invention, in the before-mentioned aspects, the phase-shifting circuit comprises an operational amplifier, a capacitor, a resistor, frequency detection means provided to determine an amount of phase shift for detecting a frequency of a signal directly proportional to a voltage or a current of the system under measurement, switching means provided for achieving a desired time constant in accordance with the capacitor and the resistor, and a decoder for generating a selection signal selecting a switch of the switching means based on an output of the frequency detection means.

According to another aspect of the invention, in the before-mentioned aspects, the frequency detection means outputs a prescribed signal for each period of the signal directly proportional to the voltage or the current of the system under measurement.

According to another aspect of the invention, the before-mentioned aspects farther comprise digital integration means provided for calculating a reactive energy.

According to the invention, therefore, there can be achieved a reactive power calculation system and a reactive electric energy measuring system, with the following advantages. Firstly, because the analog circuitry is a compact and low-cost implementation is possible, even in the form of an LSI. Secondly, by minimizing software processing, software processing is facilitated, or an entirely hardware implementation is possible. Thirdly, the ability to raise the sampling speed enables high precision.

While preferred embodiments of the present invention have been described using specific terms, such description is for illustrative purposes, and it is to be understood that changes and variations may be made without departing from the spirit or scope of the following claims.

What is claimed is:

1. An electric power calculation system which coverts signals directly proportional to a voltage and a current of a system under measurement to digital values respectively using A/D converters to calculate reactive power, wherein a time delay is imparted to a digital value of the voltage or current to be phase-shifted by phase shift means using shift registers,
wherein the A/D converters comprise 1-bit A/D converters, and wherein the phase shift means imparts the time delay to a 1-bit data output from an A/D converter to effect a phase shift,
wherein the phase shift means comprises the shift registers for successively shifting the 1-bit data output from the 1-bit A/D converter, frequency detection means provided to determine an amount of the phase shift for counting a frequency of a signal directly proportional to the voltage or the current of the system under measurement, gate means provided for selecting a desired shift stage of the shift registers, and a decoder for generating a selection signal for selecting a gate of the gate means based on an output of the frequency detection means.

2. An electric power calculation system according to claim 1, wherein the frequency detection means outputs a prescribed signal for each period of the signal directly proportional to the voltage or the current of the system under measurement.

3. An electric power calculation system according to claim 1, wherein the frequency detection means outputs a prescribed signal for each plurality of periods of the signal directly proportional to the voltage or the current of the system under measurement.

4. An electric power calculation system which coverts signals directly proportional to a voltage and a current of a system under measurement to digital values respectively using A/D converters to calculate reactive power, wherein a phase shift is performed by a phase-shifting circuit formed by a capacitor, resistors, and an operational amplifier, disposed before an A/D converter at a voltage side or current side,
wherein the A/D converters comprise 1-bit A/D converters,
wherein the phase-shifting circuit comprises the operational amplifier, the capacitor, the resistors, frequency detection means provided to determine an amount of phase shift for detecting a frequency of a signal directly proportional to the voltage or the current of the system under measurement, switching means provided for achieving a desired time constant in accordance with the capacitor and a resistor, and a decoder for generating a selection signal for selecting a switch of the switching means based on an output of the frequency detection means.

5. An electric power calculation system according to claim 4, wherein the frequency detection means outputs a prescribed signal for each period of the signal directly proportional to the voltage or the current of the system under measurement.

6. An electric power calculation system according to claim 4, wherein the frequency detection means outputs a prescribed signal for each plurality of periods of the signal directly proportional To the voltage or the current of the system under measurement.

7. A reactive power calculator in which
a first signal proportional to one of voltage and current signals of a system to be measured undergoes a first A/D conversion and a phase shift to provide a first digital value,
a second signal proportional to the other of the voltage and current signals undergoes a second A/D conversion to provide a second digital value, and
the first and second digital values are used to calculate reactive power of the system, the reactive power calculator comprising:
a combination of
a first 1-bit A/D converter for performing the first A/D conversion, and
a phase shifter for performing the phase shift,
the combination of the first 1-bit A/D converter and the phase shifter being configured to provide the first digital value as a 1-bit code of the first signal with a time delay;

a second 1-bit A/D converter for performing the second A/D conversion to provide the second digital value as a 1-bit code of the second signal;

a first up-down counter controlled with the 1-bit code of the first signal for performing an up-down count to provide a first count data;

a second up-down counter controlled with the 1-bit code of the second signal for performing an up-down count to provide a second count data;

a data selector for alternately selecting one of the first and second count data to be output therefrom;

an adder-subtractor for performing an addition-subtraction between a current output of the data selector and a previous output of the data selector; and a switch for mutually switching an addition and a subtraction of the addition-subtraction of the adder-subtractor depending on a combination of the 1-bit code of the first signal and the 1-bit code of the second signal.

8. A reactive power calculator according to claim 7, wherein the phase shifter comprises a semiconductor memory for performing the phase shift of an output of the first 1-bit A/D converter to provide the 1-bit code of the first signal with the time delay.

9. A reactive power calculator according to claim 7, wherein the phase shifter comprises an array of shift registers for performing the phase shift of an output of the first 1-bit A/D converter to provide the 1-bit code of the first signal with the time delay.

10. A reactive power calculator according to claim 7, wherein the phase shifter comprises a combination of a capacitor, resistors, and an operational amplifier for performing the phase shift of the first signal.

11. A reactive power calculator according to claim 7, further comprising a summer for summing an output of the adder-subtractor to calculate the reactive power.

12. A reactive power calculator according to claim 7, further comprising a processor for processing a data of the reactive power to calculate a reactive energy of the system.

13. A reactive power calculator according to claim 12, further comprising a display for indicating one of the reactive power and the reactive energy.

14. A reactive power calculator according to claim 7, comprising a solid state circuit including the combination of the first 1-bit AID converter and the phase shifter, the second 1-bit A/D converter, the first up-down counter, the second up-down counter, the data selector, the adder-subtractor, and the switch.

15. A reactive power calculator according to claim 14, comprising an LSI including the solid state circuit.

16. A reactive power calculator according to claim 7, wherein:

the first 1-bit AID converter converts the first signal into a digital data; and the digital data is phase-shifted by the phase shifter using a semiconductor memory to provide the 1-bit code of the first signal with the time delay.

17. A reactive power calculator according to claim 7, wherein:

the first 1-bit AID converter converts the first signal into a digital data, and the digital data is phase-shifted by the phase shifter using shift registers to provide the 1-bit code of the first signal with the time delay.

18. A reactive power calculator according to claim 7, wherein:

the phase shifter comprises a phase-shifting circuit configured with a capacitor, resistors, and an operational amplifier;

the first signal is phase-shifted by the phase-shifter to provide a phase-shifted signal; and the first 1-bit A/D converter converts the phase-shifted signal into the 1-bit code of the first signal with the time delay.

19. A reactive power calculator according to claim 16, wherein the phase shifter imparts the time delay to a 1-bit data output from the first 1-bit A/D converter to effect the phase shift.

20. A reactive power calculator according to claim 17, wherein the phase shifter imparts the time delay to a 1-bit data output from the first 1-bit A/D converter to effect the phase shift.

21. A reactive power calculator according to claim 18, wherein the phase shifter imparts the time delay to the first signal to effect the phase shift.

22. A reactive power calculator according to claim 19, wherein the phase shifter comprises:

the semiconductor memory for successively storing the 1-bit data from the first 1-bit A/D converter;

a counter for counting a clock to determine a write address of the semiconductor memory to be output;

a frequency detector for detecting a frequency of the first signal to determine an amount of the phase shift to be output; and a determiner for determining a read address of the semiconductor memory depending on a combination of an output of the counter and an output of the frequency detector.

23. A reactive power calculator according to claim 20, wherein the phase shifter comprises:

the shift registers for successively shifting the 1-bit data from the first 1-bit A/D converter;

a frequency detector for detecting a frequency of the first signal to determine an amount of the phase shift to be output;

a decoder for decoding an output of the frequency detector to provide a selection signal; and gates of which one is selectable by the selection signal to operate an associated shift stage of the shift registers.

24. A reactive power calculator according to claim 21, wherein the phase-shifting circuit further comprises:

a frequency detector for detecting a frequency of the first signal to determine an amount of the phase shift to be output;

a decoder for decoding an output of the frequency detector to provide a selection signal; and switches of which any one is selectable by the selection signal to have a desirable time constant established by cooperation of the capacitor and an associated one of the resistors.

25. A reactive power calculator according to claim 22, wherein the frequency detector outputs a prescribed signal for each period of the first signal.

26. A reactive power calculator according to claim 23, wherein the frequency detector outputs a prescribed signal for each period of the first signal.

27. A reactive power calculator according to claim 24, wherein the frequency detector outputs a prescribed signal for each period of the first signal.

28. A reactive power calculator according to claim 22, wherein the frequency detector outputs a prescribed signal for each plurality of periods of the first signal.

29. A reactive power calculator according to claim 23, wherein the frequency detector outputs a prescribed signal for each plurality of periods of the first signal.

30. A reactive power calculator according to claim 24, wherein the frequency detector outputs a prescribed signal for each plurality of periods of the first signal.

31. A reactive power calculator according to claim 16, further comprising a digital integrator for integrating the reactive power to calculate a reactive energy.

32. A reactive power calculator according to claim 17, further comprising a digital integrator for integrating the reactive power to calculate a reactive energy.

33. A reactive power calculator according to claim 18, further comprising a digital integrator for integrating the reactive power to calculate a reactive energy.

* * * * *